United States Patent [19]
Segaram et al.

[11] Patent Number: 5,336,946
[45] Date of Patent: Aug. 9, 1994

[54] DIFFERENTIAL OUTPUT STAGE WITH REDUCED IDLE CURRENT

[75] Inventors: Para K. Segaram, Campbell; Shu-Ing Ju, Santa Clara, both of Calif.

[73] Assignee: National Semiconductor Corporation, Santa Clara, Calif.

[21] Appl. No.: 995,193

[22] Filed: Dec. 22, 1992

[51] Int. Cl.$^5$ .............................................. H03K 5/22
[52] U.S. Cl. .................................. 307/355; 307/494; 307/356
[58] Field of Search ............... 307/355, 356, 359, 494; 330/255

[56] References Cited

U.S. PATENT DOCUMENTS

| | | | |
|---|---|---|---|
| 4,795,916 | 1/1989 | Liron | 307/355 |
| 4,806,791 | 2/1989 | Mizuide | 307/355 |
| 5,077,756 | 12/1991 | Christophersen | 330/255 |
| 5,179,292 | 1/1993 | Lee | 307/355 |

*Primary Examiner*—Timothy P. Callahan
*Assistant Examiner*—Toan Tran
*Attorney, Agent, or Firm*—Limbach & Limbach

[57] ABSTRACT

A differential output stage utilizes four unity-gain differential amplifiers to receive a pair of input signals and to generate a differential signal. The non-inverting inputs of two of the differential amplifiers are connected together to receive one of the input signals while the outputs of the two differential amplifiers are connected to a forward node and to the inverting inputs of the two differential amplifiers. The non-inverting inputs of the remaining two differential amplifiers are connected together to receive the remaining input signals while the outputs of the remaining two differential amplifiers are connected to a reverse node and to the inverting inputs of the remaining two differential amplifiers. When an external resistor is connected between the forward node and the reverse node, the differential output stage drives a current across the external resistor in one direction when the difference between the amplitudes of the input signals is positive and drives a current across the external resistor in an opposite direction when the difference between the amplitudes of the input signals is negative.

17 Claims, 7 Drawing Sheets

DIFFERENTIAL OUTPUT STAGE WITH REDUCED IDLE CURRENT

RELATED APPLICATION

The present application is related to commonly-assigned U.S. patent application Ser. No. 07/994,660, filed by Para K. Segaram et al. of even date herewith, for AN INTEGRATED WAVESHAPING CIRCUIT and commonly-assigned U.S. patent application Ser. No. 07/995,598, filed by Prasun K. Paul of even date herewith, for AN ARCHITECTURE FOR A CODING AND TRANSCEIVING ETHERNET CIRCUIT. The referenced related applications are hereby incorporated by reference to provide additional background information regarding the present invention.

BACKGROUND OF THE INVENTION

1. Field of the Invention

The present invention relates to semiconductor integrated circuits and, in particular to a differential output stage that reduces the idle current consumed by the output stage when its differential inputs are substantially equal.

2. Description of the Related Art

A differential output stage is an amplifier circuit which generates a differential signal in response to a pair of input signals. In a local area network defined by the IEEE 802.3 standard, the input signals include a Manchester-encoded data signal Vin+ and a complementary Manchester-encoded data signal Vin−.

In integrated circuit applications, the differential signal is typically generated by driving a current across a low-impedance external resistor in one direction when the difference between the data signal Vin+ and the complementary data signal Vin− is positive and by driving a current across the low-impedance external resistor in the opposite direction when the difference between the data signal Vin+ and the complementary data signal Vin− is negative.

FIG. 1 shows a conventional integrated circuit differential output stage 1 connected to an external resistor network 2. The conventional differential output stage 1 typically consists of both a npn forward transistor 3 and a npn reverse transistor 4. As shown in FIG. 1, the base of the forward transistor 3 is connected to receive the data signal Vin+ while the base of the reverse transistor 4 is connected to receive the complementary data signal Vin−.

The external resistor network 2 includes a forward resistor 5 which is connected between the emitter node of the forward transistor 3 and ground, a reverse resistor 6 which is connected between the emitter node of the reverse transistor 4 and ground, and a difference resistor 7 which is connected between the emitter node of the forward transistor 3 and the emitter node of the reverse transistor 4. The forward transistor 3 and the reverse transistor 4 as well as the forward resistor 5 and the reverse resistor 6 are generally matched.

The output stage 1 shown in FIG. 1 operates by oppositely varying the base-emitter voltages of the forward transistor 3 and the reverse transistor 4. When the difference between the data signal Vin+ and the complementary data signal Vin− is positive, the base-emitter voltage of the forward transistor 3 increases, thereby generating more current, while the base-emitter voltage of the reverse transistor 4 decreases, thereby generating less current. This produces a voltage differential across the difference resistor 7 which causes a current to flow across the difference resistor 7 from the emitter node of the forward transistor 3 to the emitter node of the reverse emitter transistor 4, thereby generating a positive differential signal.

Similarly, when the difference between the data signal Vin+ and the complementary data signal Vin− is negative, the base-emitter voltages of the forward transistor 3 and the reverse transistor 4 are reversed. This condition causes a current to flow across the difference resistor 7 from the reverse emitter node to the forward emitter node, thereby generating a negative differential signal.

When, however, the voltage of the data signal Vin+ and the complementary data signal Vin− are substantially equivalent, both the forward transistor 3 and the reverse transistor 4 are biased to output a substantially equivalent idle current. Since the forward and reverse transistors (3, 4) and the forward and reverse resistors (5, 6) are matched, the voltage at the emitter nodes of both the forward transistor 3 and the reverse transistor 4 are approximately equivalent. Thus, substantially no current flows across the difference resistor and no differential signal is generated.

Although substantially no current flows across the external difference resistor 7 when the data signal Vin+ and the complementary data signal Vin− are equivalent, the idle current generated by both the forward and the reverse transistors (3, 4) continuously flows across the forward and reverse resistors (5, 6), respectively. When the output stage 1 is utilized to drive the differential signal onto a local area network defined by the IEEE 802.3 standard, the combined idle current generated by both the forward transistor 3 and reverse transistor 4 is typically on the order of 52 milliamperes.

Thus, the output stage 1 consumes a significant quantity of power when the differential signal is not generated. Therefore, there is a need for a differential output stage that consumes less current in the idle mode.

SUMMARY OF THE INVENTION

The present invention provides a differential output stage that generates an output signal across an external resistor in response to the difference in voltage between a pair of differential signals, and that consumes very little current when the voltages of the differential signals are substantially equivalent by utilizing a configuration of differential amplifiers.

In accordance with the present invention, a differential output stage includes a forward node and a reverse node. The external resistor is connectable between the forward node and the reverse node. The differential output stage also includes a forward current source, a reverse current source, a forward current sink, and a reverse current sink. The forward current source generates a forward current into the forward node in response to the voltage of a first signal and the voltage at the forward node. The first signal can include, for example, a first differential signal of a pair of differential signals. The reveres current source generates a reverse current into the reverse node in response to the voltage of a second signal and the voltage at the reverse node. The second signal can include, for example, a second differential signal of a pair of differential signals. The forward current sink sinks a first current from the forward node in response to the voltage of the first signal and the voltage at the forward node. The reverse current sink sinks a second current from the reverse node in response to the voltage of the second signal and the voltage at the reverse node.

In operation, when the voltage of the first signal and the voltage of the second signal are substantially equivalent, the magnitude of the forward current is substantially equivalent to the magnitude of the first current, and the magnitude of the reverse current is substantially equivalent o the magnitude of the second current, thereby causing no current to flow across the external resistor.

When the difference between the voltage of the first signal and the voltage of the second signal is positive, the magnitude of the forward current is greater than the magnitude of the first current, and the magnitude of the reverse current is less than the magnitude of the second current, thereby causing a current to flow across the external resistor from the forward node to the reverse node.

When the difference between the voltage of the first signal and the voltage of the second signal is negative, the magnitude of the forward current is less than the magnitude of the first current, and the magnitude of the reverse current is greater than the magnitude of the second current, thereby causing a current to flow across the external resistor from the reverse node to the forward node.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIG. 6 shows the block diagram of the FIG. 2 embodiment with the addition of an external inductor L placed in parallel with the external difference resistor Rd.

FIGS. 8A and 8B show the FIG. 6 block diagram and a first equivalent output impedance circuit diagram, respectively. FIG. 8C shows a second equivalent output impedance circuit diagram.

DETAILED DESCRIPTION

Figure 1:
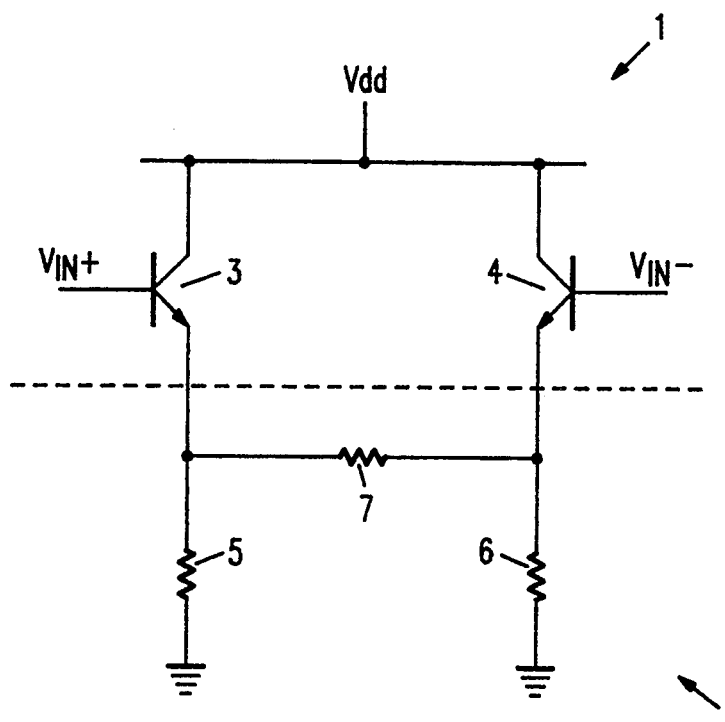
FIG. 1 shows a conventional unity-gain differential output stage connected to an external resistor network.
Figure 2:
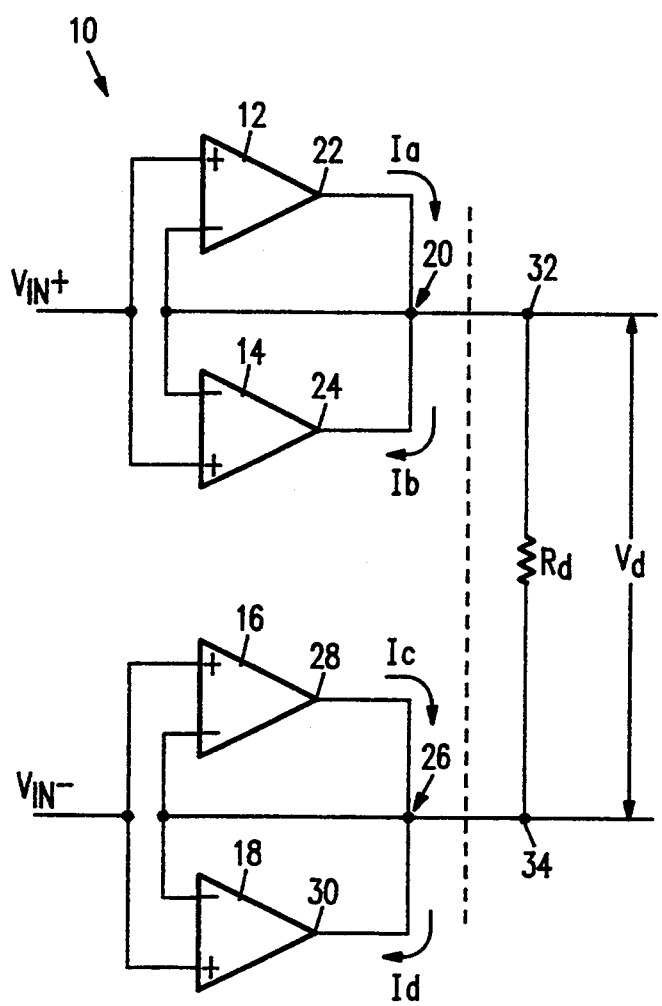
FIG. 2 shows a block diagram of the differential output stage of the present invention.

FIG. 2 shows an embodiment of a differential output stage 10 in accordance with the present invention. In the FIG. 2 embodiment, the differential output stage receives a Manchester-encoded data signal Vin+ and a complementary Manchester-encoded data signal Vin− and generates a differential signal Vd in response.

Differential output stage 10 includes a forward current source 12, a forward current sink 14, a reverse current source 16, and a reverse current sink 18. In the preferred embodiment of the present invention, forward current source 12, forward current sink 14, reverse current source 16, and reverse current sink 18 are each unity gain differential amplifiers.

As shown in FIG. 2, both the non-inverting input of forward current source 12 and the non-inverting input of forward current sink 14 are connected to receive the data signal Vin+ while both the inverting input of forward current source 12 and the inverting input of forward current sink 14 are connected to a forward node 20. Both the output 22 of forward current source 12 and the output 24 of forward current sink 14 are also connected to the forward node 20.

Similarly, both the non-inverting input of reverse current source 16 and the non-inverting input of reverse current sink 18 are connected to receive the complementary data signal Vin− while both the inverting input of reverse current source 16 and the inverting input of reverse current sink 18 are connected to a reverse node 26. Both the output 28 of reverse current source 16 and the output 30 of reverse current sink 18 are also connected to the reverse node 30.

As further shown in FIG. 2, the output 22 of forward current source 12 and the output 24 of forward current sink 14 are connected to one end 32 of an external difference resistor Rd while the output 28 of reverse current source 16 and the output 30 of reverse current sink 18 are connected to the other end 34 of the external resistor Rd.

Figure 3C:
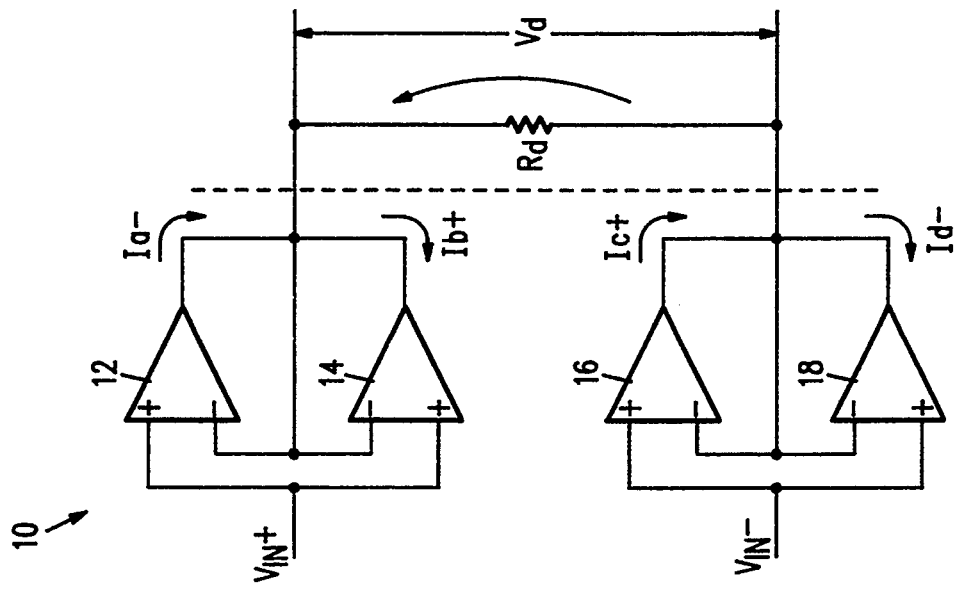
FIG. 3C shows the current flow of the differential output stage of the present invention when the difference between the amplitude of the data signal Vin+ and the amplitude of the complementary data signal Vin− is negative.
Figure 3B:
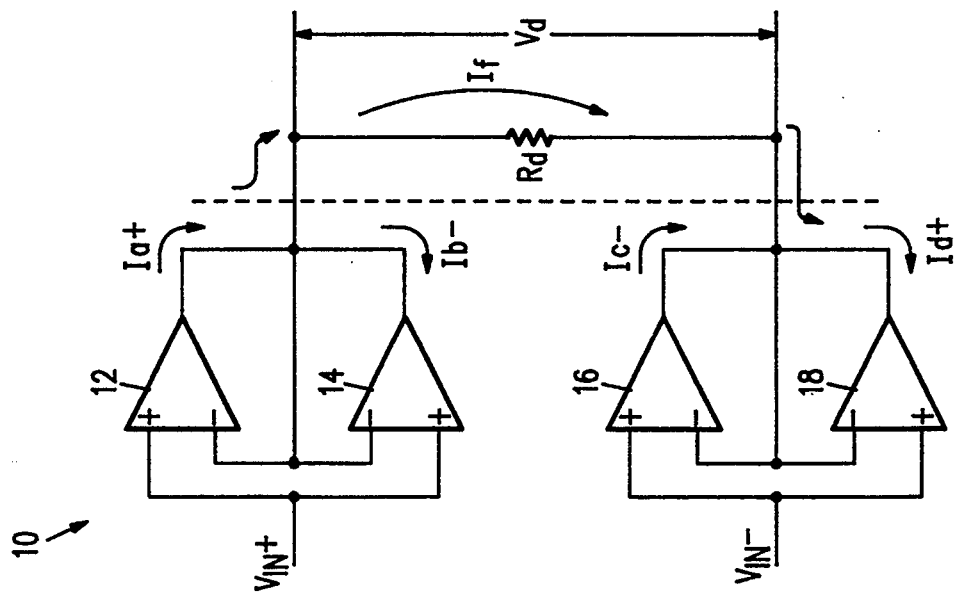
FIG. 3B shows the current flow of the differential output stage of the present invention when the difference between the amplitude of the data signal Vin+ and the amplitude of the complementary data signal Vin− is positive.
Figure 3A:
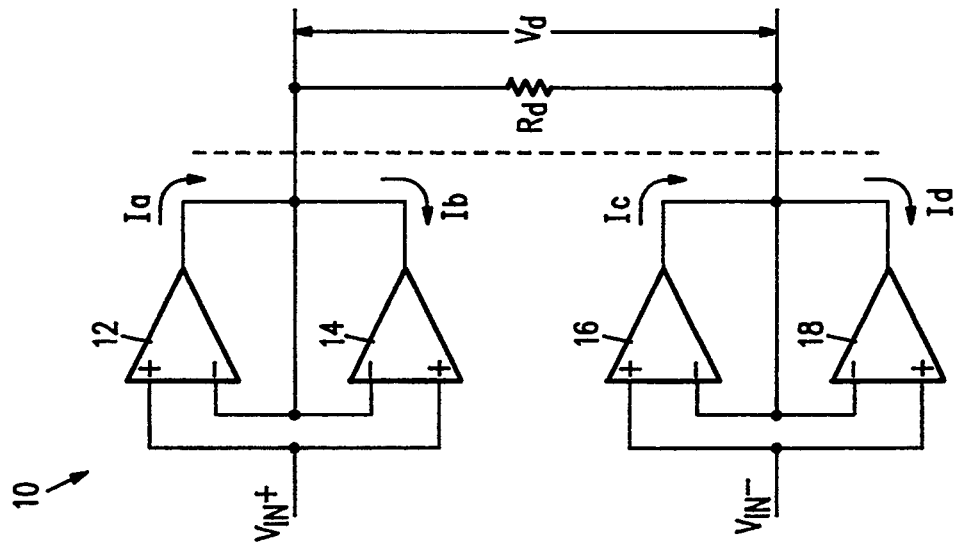
FIG. 3A shows the current flow of the differential output stage of the present invention when the amplitude of a data signal Vin+ and the amplitude of a complementary data signal Vin− are substantially equivalent.

The operation of the differential output stage 10 is shown in FIGS. 3A–C. Differential output stage 10 generates the differential signal Vd by driving a forward current If across an external difference resistor Rd when the difference between the amplitude of the data signal Vin+ and the amplitude of the complementary data signal Vin− is positive (see FIG. 3B) and by driving a reverse current Ir across the difference resistor Rd when the difference is negative (see FIG. 3C).

FIG. 3A shows a block diagram of the current flow when the amplitude of the data signal Vin+ and the amplitude of the complementary data signal Vin− are substantially equivalent. In the equivalent condition, forward current source 12 outputs an idle forward source current Ia while forward current sink 14 inputs an idle forward sink current Ib. In this condition, the idle forward source current Ia is substantially equivalent to the idle forward sink current Ib. Thus, as shown in FIG. 3A, forward current sink 14 inputs substantially all of the idle forward source current Ia output by forward current source 12.

At the same time, reverse current source 16 outputs an idle reverse source current Ic while reverse current sink 18 outputs an idle reverse sink current Id. Similarly, the idle reverse source current is substantially equivalent to the idle reverse sink current Id input. Thus, as also shown in FIG. 3A, reverse current sink 18 inputs substantially all of the idle reverse source current Ic from reverse current source 16.

In addition, the idle forward source current Ia is substantially equivalent to the idle reverse source current Ic−. Thus, in the equivalent condition, substantially no current flows across external difference resistor Rd.

FIG. 3B shows a block diagram of the current flow when the difference between the amplitude of the data signal Vin+ and the amplitude of the complementary data signal Vin− is positive. With a positive difference, forward current source 12 outputs an increased forward source current Ia+ while forward current sink 14 inputs a reduced forward sink current Ib−.

The positive difference also causes reverse current source 16 to output a reduced reverse source current Ic− while reverse current sink 18 inputs an increased reverse sink current Id+. Thus, as shown in FIG. 3B, the difference in current between the increased forward source current Ia+ and the reduced forward sink current Ib− causes the forward current If to flow across external difference resistor Rd. The forward current If and the reduced reverse source current Ic− are sunk by reverse current sink 18.

FIG. 3C shows a block diagram of the current flow when the difference between the amplitude of the data signal Vin+ and the amplitude of the complementary data signal Vin− is negative. With a negative difference, forward current source 12 outputs a reduced forward source current Ia− while forward current sink 14 inputs an increased forward sink current Ib+.

The negative difference also causes reverse current source 16 to output an increased reverse source current Ic+ while reverse current sink 18 inputs a decreased reverse sink current Id−. Thus, as shown in FIG. 3C, the difference in current between the increased reverse source current Ic+ and the decreased reverse sink current Id− causes the reverse current Ir to flow across external difference resistor Rd. The reverse current Ir and the reduced forward source current Ia− are sunk by forward current sink 14.

Figure 4:
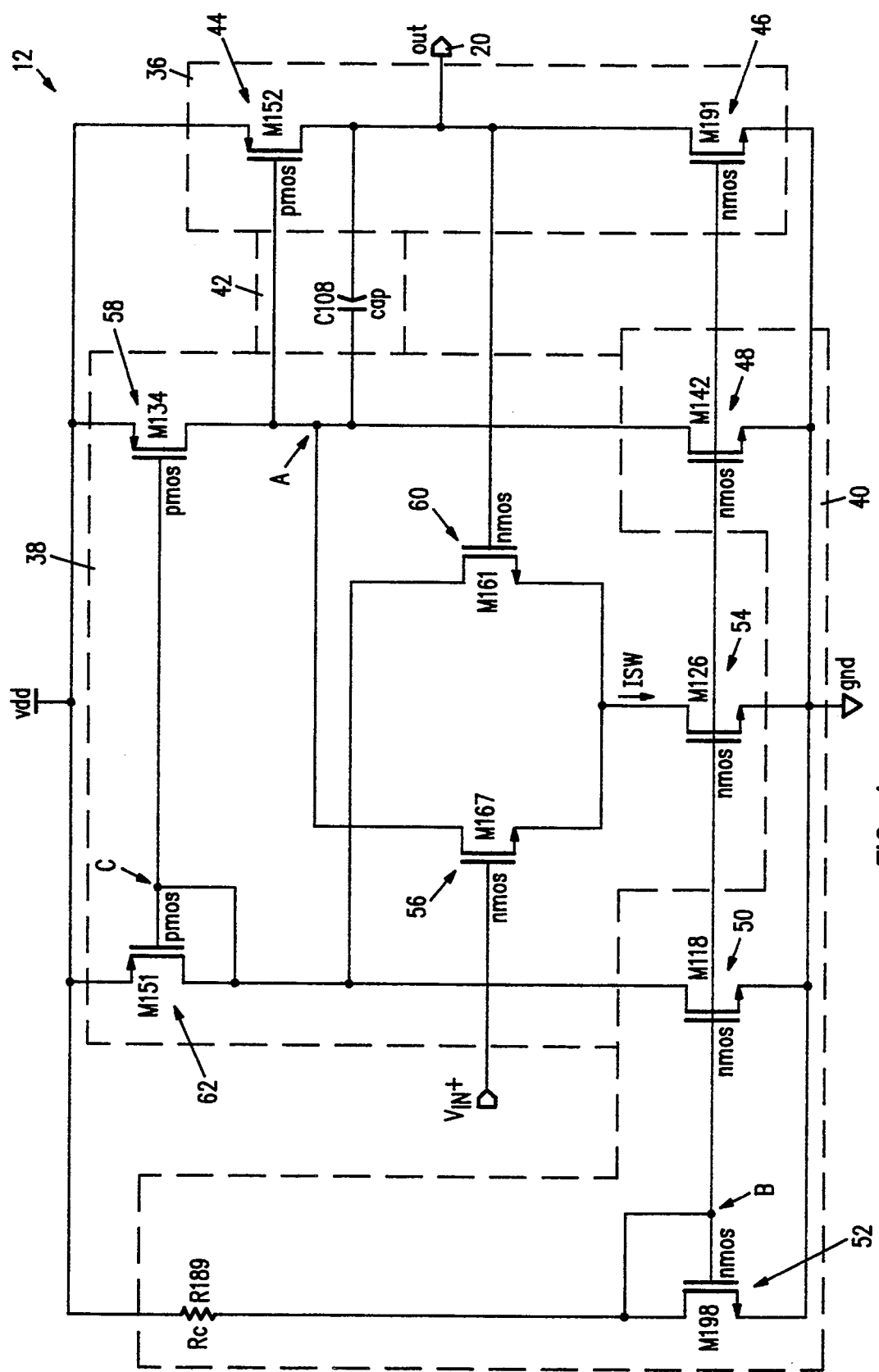
FIG. 4 shows a circuit diagram which illustrates both the forward current source and the reverse current source of the differential output stage of the present invention.

FIG. 4 shows a schematic diagram of an embodiment of forward current source 12 in accordance with the present invention. As shown in FIG. 4, forward current source 12 includes a driver transistor stage 36 for driving the idle, the increased, and the reduced forward source currents Ia, Ia+, and Ia−, respectively, a slew rate stage 40 for increasing the slew rate of driver transistor stage 36, a differential pair stage 38 for controlling driver transistor stage 36, and a compensation capacitor 42 for preventing oscillation in the voltage at the forward node 20.

Driver transistor stage 36 includes a driver transistor 44 and a balancing transistor 46. Driver transistor 44 is a p-channel transistor which has its source connected to the power supply Vdd, its drain connected to the output node OUT, and its gate connected to a control node A. Balancing transistor 46 has its source connected to ground, its drain connected to the output node OUT, and its gate connected to a first node B. Balancing transistor 46, which is connected as a current mirror, sinks a fixed current to reduce the output impedance.

When the amplitude of the data signal Vin+ is substantially equivalent to the amplitude of the complementary data signal Vin−, the gate of driver transistor 44, as described in greater detail below, is biased by a voltage on the control node A which causes driver transistor 44 to output the idle forward source current Ia.

When the difference between the amplitude of the data signal Vin+ and the amplitude of the complementary data signal Vin− is positive, the voltage on the control node A falls, as described in greater detail below, causing driver transistor 44 to output the increased forward source current Ia+. Similarly, when the difference between the data signal Vin+ and the complementary data signal Vin− is negative, the voltage at the control node A increases, as described in greater detail below, causing driver transmitter 44 to output the reduced forward source current Ia−.

Slew rate stage 40, which increases the slew rate of driver transistor stage 36, includes a n-channel input slew rate transistor 48, a n-channel output slew rate transistor 50, a diode transistor 52, and a current resistor Rc.

Input slew rate transistor 48 has its source connected to ground, the drain connected to the control node A, and its gate connected to a first node B. Output slew rate transistor 50 has its source connected to ground, the drain connected to a second node C, and its gate connected to the first node B. Diode transistor 52 has its source connected to ground and both its drain and gate connected to the first node B and to the power supply Vdd via the current resistor Rc. As described, input slew rate transistor 48 and output slew rate transistor 50 are configured as current mirrors.

Input slew rate transistor 48 and output slew rate transistor 50 increase the slew rate of driver transmitter stage 36 by reducing the impedance at the control node A and the second node C, respectively, by sinking a constant current from the control node A and the second node C, respectively.

Differential pair stage 38 controls driver transistor 44 by controlling the voltage at the control node A. Differential pair stage 38 includes an input leg, an output leg, and a tail current source 54. Tail current source 54 sinks a fixed current ISW, a portion of which is provided by both the input leg and the output leg.

As further shown in FIG. 4, the input leg includes an n-channel input transistor 56 and a p-channel input charging transistor 58. Input transistor 56 has its source connected to ground through tail current source 54, its drain connected to the control node A, and its gate connected to receive the data signal Vin+. Input charging transistor 58 has its source connected to the power supply Vdd, its drain connected to the control node A, and its gate connected to the second node C.

Similarly, the output leg includes an n-channel output transistor 60 and a p-channel output charging transistor 62. Output transistor 60 has its source connected to ground through tail current source 54, its drain connected to the second node C, and its gate connected to the output node OUT. Output charging transistor 62 has its source connected to the power supply Vdd and both its drain and gate connected to the second node C.

Tail current source 54 has its source connected to ground and its drain and gate connected to the first node B. As described, input charging transistor 58 and tail current source 54 are configured as current mirrors.

In operation, when the amplitude of the data signal Vin+ and the amplitude of the complementary data signal Vin− are substantially equivalent, the gate voltages of input transistor 56 and output transistor 60 are substantially equivalent.

In this equivalent condition, both input transistor 56 and output transistor 60 provide a substantially equivalent portion of the fixed current ISW which is sunk by tail current source 54. Input transistor 56 and output transistor 60 receive their respective portions of the fixed current ISW from input charging transistor 58 and output charging transistor 62, respectively. Thus, in the equivalent condition, the drain voltage of input charging transistor 58, which is set by input transistor 56, determines the voltage on the control node A. The voltage on the control node A, as stated above, causes driver transistor 44 to generate the idle forward source current Ia.

When the amplitude of the data signal Vin+ begins to rise so that the difference between the amplitude of the data signal Vin+ and the amplitude of the complementary data signal Vin− is positive, the gate voltage and, to a lesser extent, the source voltage of input transistor 56 begin to rise. As the gate-to-source voltage of input transistor 56 increases, input transistor 56 begins to source a greater proportion of the fixed current ISW to tail current source 54.

At the same time, the increasing source voltage causes output transistor 60 to begin to source a corresponding lesser proportion of the fixed current ISW, thereby increasing the voltage at the second node C.

The increasing demand for current by input transistor 56 and the rising voltage on the second node C cause the voltage at the control node A to fall. As stated above, by decreasing the voltage on the control node A, the driver transistor 44 begins to output the increased forward source current Ia+.

Similarly, when the difference between the amplitude of the data signal Vin+ and the amplitude of the complementary data signal Vin− is negative, the gate voltage and, to a lesser extent, the source voltage of input transistor 56 begin to fall. As the gate-to-source voltage of input transistor 56 decreases, input transistor 56 begins to source a lesser proportion of the fixed current ISW to the tail current source 54.

At the same time, the decreasing source voltage causes output transistor 60 to begin to source a corresponding greater proportion of the fixed current ISW, thereby decreasing the voltage at the second node C. The decreasing demand for current by input transistor 56 and the decreasing voltage at the second node C cause the voltage at the control node A to rise. As stated above, by increasing the voltage at the control node A, driver transistor 44 begins to output the reduced reverse source current Ic−.

Since the complementary data signal Vin− is the complement of the data signal Vin+, the description of forward current source 12 as shown in FIG. 4 is equally applicable to reverse current source 16 (FIG. 2) except that the effects are reversed. For example, when the difference between the amplitude of the data signal Vin+ and the amplitude of the complementary data signal Vin− is positive, input transistor 56 of forward current source 12, which is connected to the data signal Vin+, provides an increased portion of the fixed current ISW while the input transistor of the reverse current source, which would be connected to the complementary data signal Vin−, provides a decreased portion of the fixed current ISW.

Figure 5:
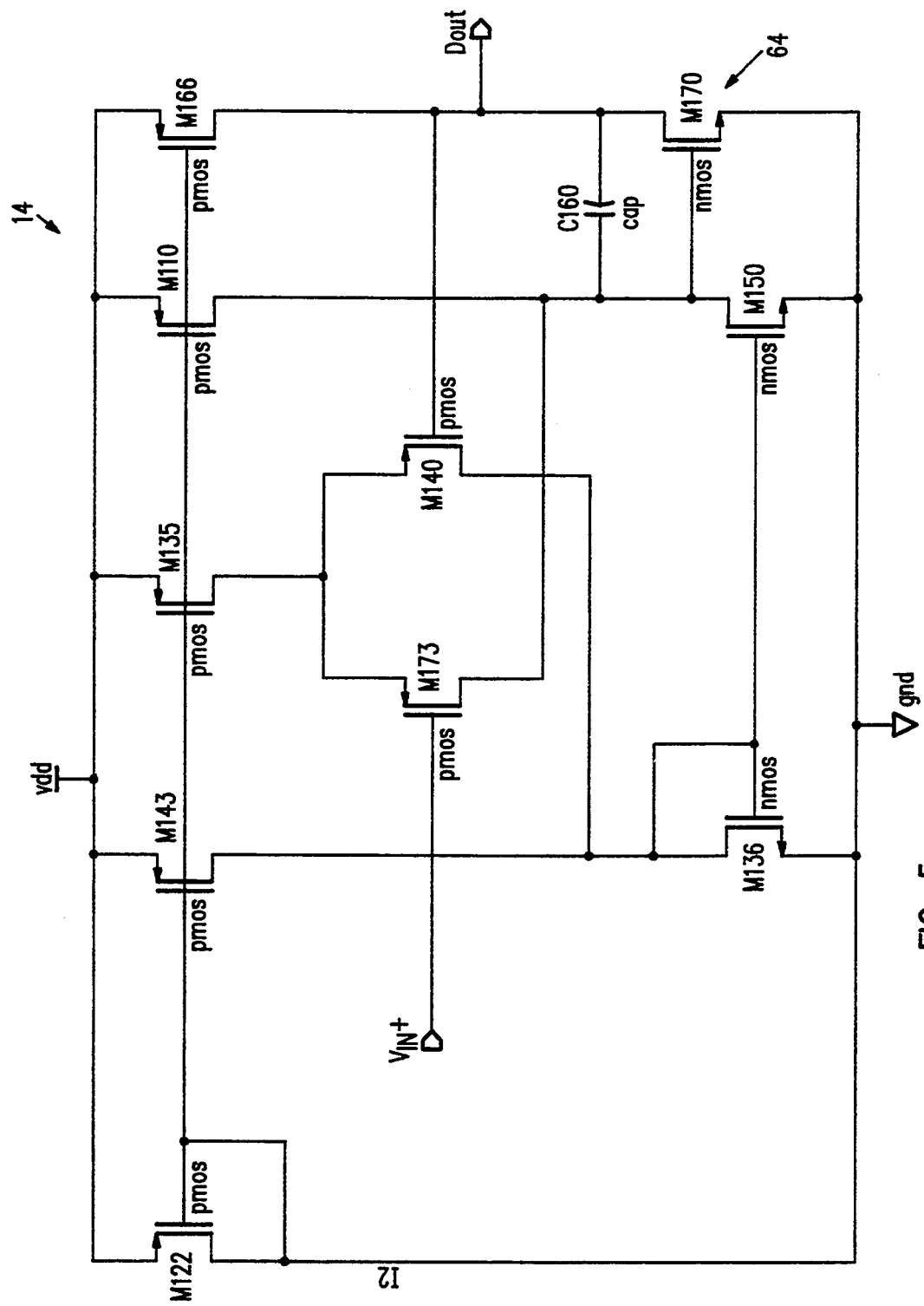
FIG. 5 shows a circuit diagram which illustrates both the forward current sink and the reverse current sink of the present invention.

FIG. 5 shows a schematic diagram of an embodiment of forward current sink 14 in accordance with the present invention. As can be seen in FIG. 5, the configuration of forward current sink 14 is substantially identical to the configuration of forward current source 12 shown in FIG. 4. The essential difference between forward current sink 14 of FIG. 5 and forward current source 12 of FIG. 4 is that each p-channel and n-channel transistor in forward current source 12 have been replaced with an n-channel and a p-channel transistor, respectively. For example, where forward current source 12 has p-channel driver transistor 44, the forward current sink 14 has a n-channel sinking transistor 64.

As with the reverse current source, the description of forward current sink 14 as shown in FIG. 5 is equally applicable to reverse current sink 18 (FIG. 2) except, as with the reverse current source, the effects are reversed.

Referring again to FIG. 2, the result of using a substantially identical configuration for forward current sink 14 and reverse current sink 18 is that forward current sink 14 responds oppositely to forward current source 12 while reverse current sink 18 responds similarly to forward current source 12. For example, when the difference between the amplitude of the data signal Vin+ and the amplitude of the complementary data signal Vin− is positive, driver transistor 44 of FIG. 4 of forward current source 12 outputs the increased forward source current Ia+ while sinking transistor 64 of FIG. 5 (the n-channel equivalent of the driver transistor in the reverse current sink) inputs an increased reverse sink current Id+.

In the preferred embodiment, differential output stage 10 of the present invention is utilized to transmit the differential signal Vd onto a local area network as defined by the IEEE 802.3 standard. In accordance with the IEEE 802.3 standard, the transmitted difference signal must be isolated from the remainder of the local area network.

Figure 6:
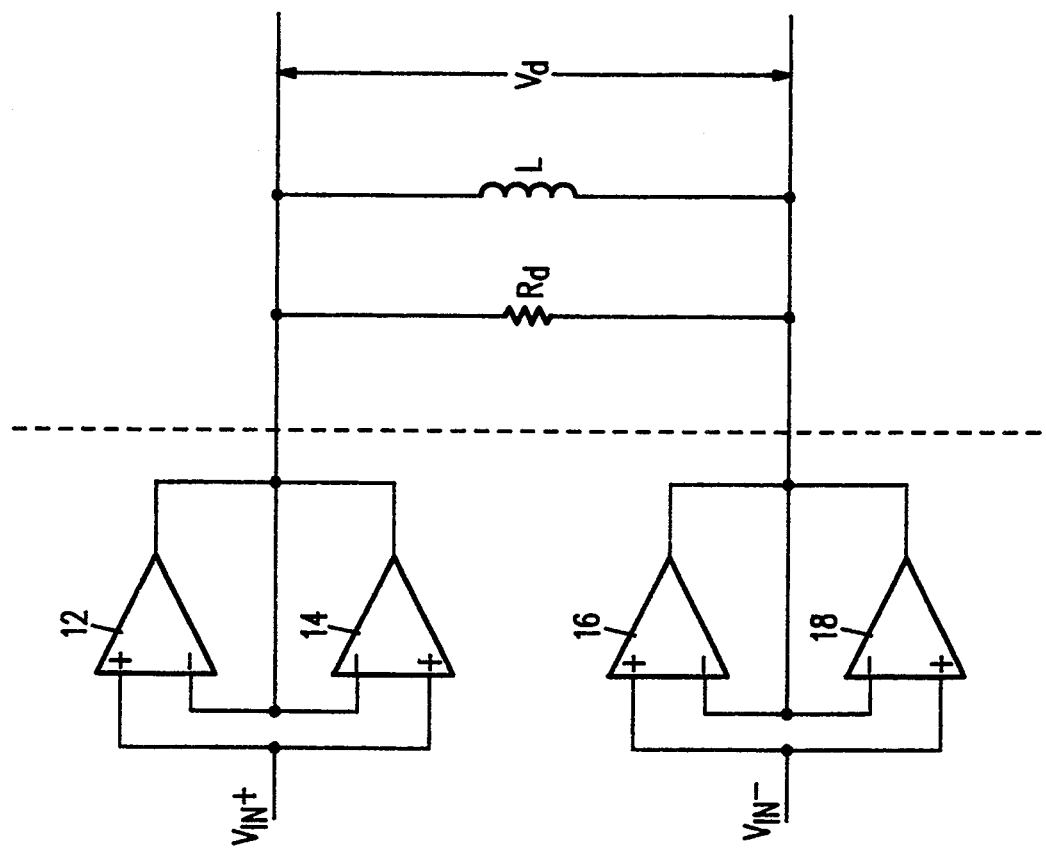
FIG. 6 illustrates a first alternative embodiment of the differential output stage of the present invention.

FIG. 6, which illustrates a first alternative embodiment of the present invention, shows the block diagram of the FIG. 2 embodiment with the addition of an external inductor L placed in parallel with external difference resistor Rd. The inductor L represents one leg of a transformer which is utilized to satisfy the isolation requirement of the IEEE 802.3 standard. The placement of inductor L in parallel with difference resistor Rd effectively filters out the low-frequency components of the differential signal Vd.

Figure 7:
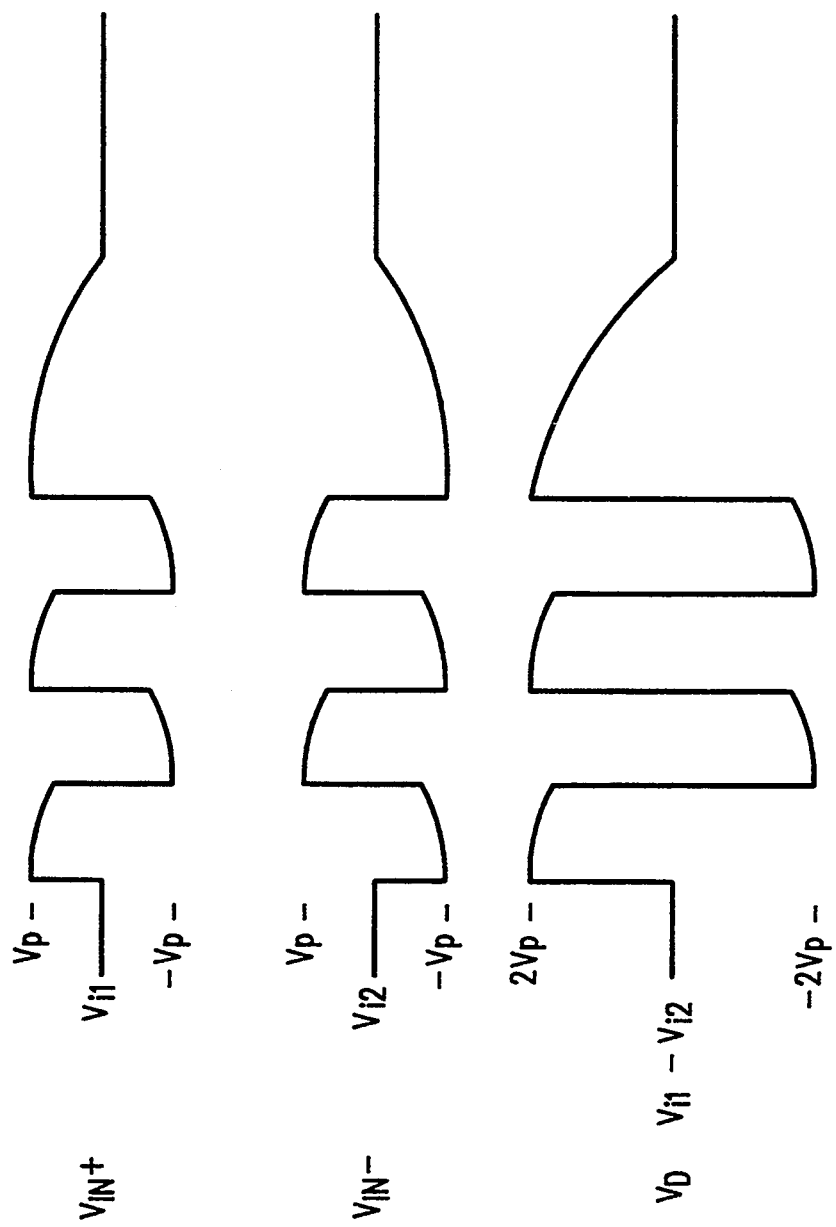
FIG. 7 shows a timing diagram of the data signal Vin+, the complementary data signal Vin−, and the effect the inductor L has on the resulting differential signal Vd.

FIG. 7 shows a timing diagram of the data signal Vin+, the complementary data signal Vin−, and the effect inductor L has on the resulting differential signal Vd. As a baseline, when the amplitudes of the data signal Vin+ and the complementary data signal Vin− are substantially equivalent, the differential signal Vd is equivalent to an output dc voltage Vi1−Vi2.

As shown in FIG. 7, when the voltage of the data signal Vin+ rises from a first dc voltage Vi1 to a positive peak voltage Vp, the voltage of the complementary data signal Vin− simultaneously falls from a second dc voltage Vi2 to a negative peak voltage −Vp. The resulting differential signal Vd first rises from the output dc voltage Vi1−Vi2 to a maximum voltage 2Vp, which is twice the positive peak voltage Vp, and then begins to decay to the output dc voltage Vi1-Vi2 at a predetermined decay rate until the data signal Vin+ begins to fall.

Similarly, when the data signal Vin+ falls to the negative peak voltage −Vp and the complementary data signal Vin− rises to the positive peak voltage Vp, the differential signal Vd first falls to a minimum voltage 2Vp, which is twice the negative peak voltage −Vp, and then begins recovering to the output dc voltage Vi1-Vi2 at the predetermined recovery rate until the data signal Vin+ begins to rise.

The IEEE 802.3 standard specifies a maximum decay rate and an equivalent recovery rate. In addition, the standard specifies an end of transmission waveform for the differential signal Vd which first rises to the maximum voltage 2Vp and then decays to the output dc voltage Vi1-Vi2 at a rate which is equal to or less than the maximum decay rate.

The instantaneous voltage Vins of the differential signal Vd when the difference between the data signal Vin+ and the complementary data signal Vin− is positive can be defined by the equation:

$$Vins = (Ia+ - Ib-)(Rrd)(e^{-Rt/Li})$$

where (Ia+ −Ib−) is the forward current If flowing across the difference resistor Rd (see FIG. 3B), Rrd is the resistance of the difference resistor Rd (the expression (Ia+ −Ib−)(Rrd) being equivalent to the maximum voltage 2Vp at t=0, see FIG. 7), R is the total output impedance, t is the time since the increased current Ia+ began, and Li is the inductance of inductor L.

Thus, as can be seen from the equation, the decay rate and the equivalent recovery rate, which are represented by the expression $(e^{-Rt/Li})$, can be changed to satisfy differing specifications by modifying the total output impedance R.

Figure 8C:
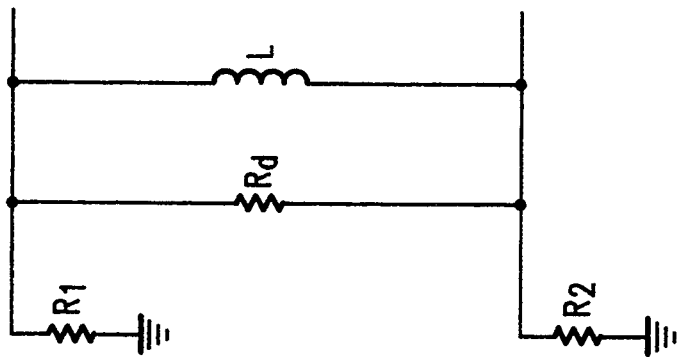
FIGS. 8A–C show a total output impedance block diagram of the FIG. 6 block diagram.
Figure 8B:
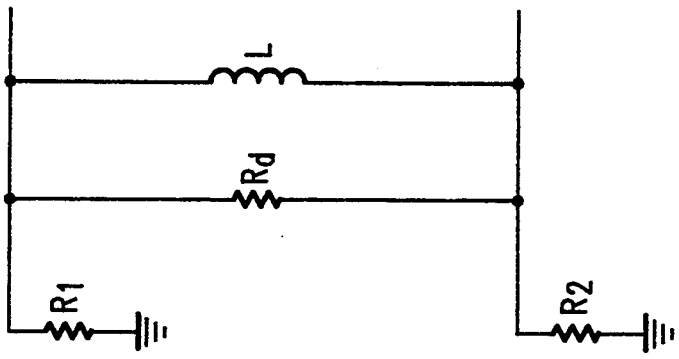
Figure 8A:
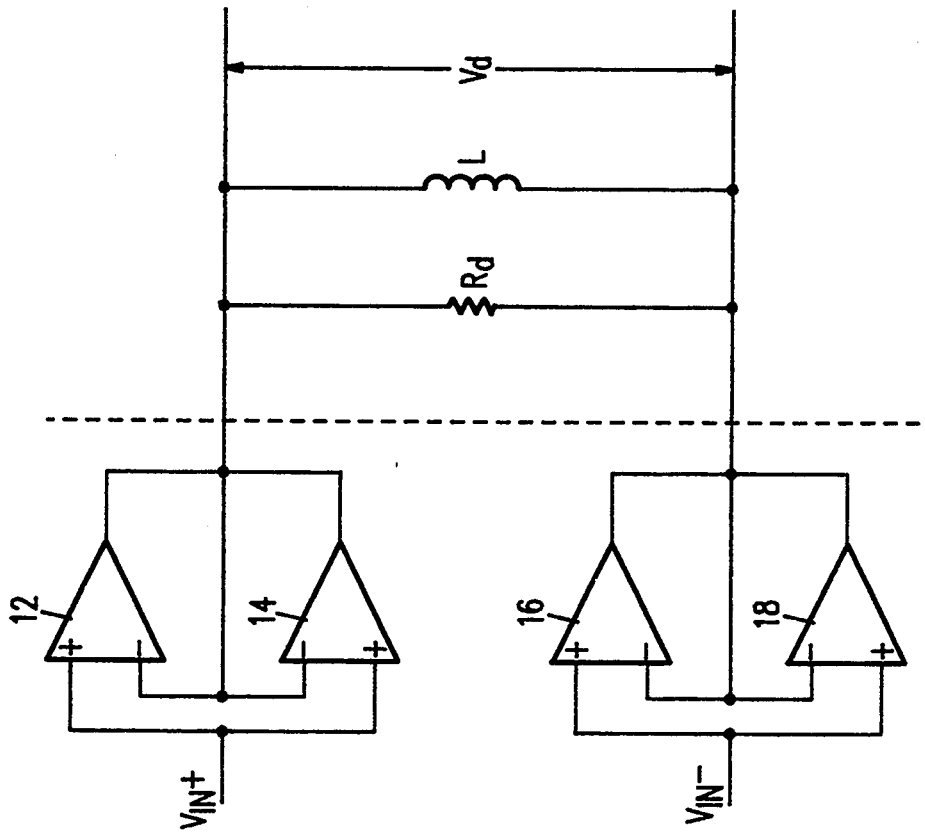

FIGS. 8A–C show a total output impedance block diagram of the FIG. 6 block diagram. The total output impedance R is calculated by determining the equivalent impedance of forward current source 12, forward current sink 14, reverse current source 16, reverse current sink 18, and external difference resistor Rd.

FIGS. 8A and 8B show the FIG. 6 block diagram and a first equivalent output impedance circuit diagram, respectively. As shown in FIGS. 8A and 8B, the output impedance of forward current source 12 and forward current sink 14 are combined in parallel to form a first equivalent impedance R1. Similarly, the output impedance of reverse current source 16 and reverse current sink 18 are also combined in parallel to form a second equivalent impedance R2.

FIG. 8C shows a second equivalent output impedance circuit diagram. As shown in FIG. 8C, the total output impedance is determined by serially combining the first equivalent impedance R1 with the second equivalent impedance R2 to form a third equivalent impedance Rd. The third equivalent impedance Rd is then combined in parallel with the impedance of external difference resistor Rd.

The output impedance for forward current source 12 can be defined by the equation:

$$R = k/i$$

where k is a function of the size of driver transistor 44 (see FIG. 4) and i is the increased forward source current Ia+ (see FIG. 3B) generated by driver transistor 44 (see FIG. 4). (Similarly, the output impedance for forward current sink 14, reverse current source 16, and reverse current sink 18 is determined by the same equation where i is the increased forward sink current Ib+, the increased reverse source current Ic+, and the increased reverse sink current Id+, respectively.)

Thus, as can be seen from the output resistance equation, as the increased forward source current Ia+ (see FIG. 3B) generated by driver transistor 44 (see FIG. 4) increases, the output impedance R of forward current source 12 decreases. Thus, by fixing the increased forward source current Ia+, the increased forward sink current Ib+, the increased reverse source current Ic+, and the increased reverse sink current Id+, a desired decay and recovery rate can be achieved.

One method for fixing the increased forward source current Ia+, the increased forward sink current Ib+, the increased reverse source current Ic+, and the increased reverse sink current Id+, and thereby fixing the total output resistance R is to fix the transistor size of both driver transistor 44 (FIG. 4) of the forward and reverse current sources and sinking transistor 64 of the forward and reverse current sinks (FIG. 5) so that the channel width ratio between the driver transistor 44 and sinking transistor 64 is in the range of approximately 2-3:1.

In the preferred embodiment of the present invention, driver transistor 44 has a length of 1.5 microns and a channel width of 800 microns while sinking transistor 64 has a length of 1.5 microns and a channel width of 400 microns.

This sizing produces an increased forward source current Ia+ and an increased reverse source current Ic+, each being approximately 4 mA, an idle forward source current Ia and the idle reverse source current Ic+, each being approximately 16 mA, and a reduced forward source current Ia− and an increased reverse source current Ic+, each being approximately 4 mA.

It should be understood that various alternatives to the structures described herein may be employed in practicing the present invention. It is intended that the following claims define the invention and that structures within the scope of these claims and their equivalents be covered thereby.

What is claimed is:

1. A differential output stage for generating a differential signal across an external resistor in response to first and second input signal, each input signal having an amplitude, the differential output stage comprising:

a forward node and a reverse node, the external resistor being connectable therebetween;

a forward current source having a first non-inverting input, a first inverting input, and a forward source output, the first non-inverting input being connected to receive the first input signal, the first inverting input and the forward source output being connected to the forward node;

a forward current sink having a second non-inverting input, a second inverting input, and a forward sink output, the second non-inverting input being connected to receive the first input signal, the second inverting input and the forward sink output being connected to the forward node;

a reverse current source having a third non-inverting input, a third inverting input, and a reverse source output, the third non-inverting input being connected to receive the second input signal, the third inverting input and the reverse source output being connected to the reverse node; and a reverse current sink having a fourth non-inverting input, a fourth inverting input, and a reverse sink output, the fourth non-inverting input being connected to receive the second input signal, the fourth inverting input and the reverse sink output being connected to the reverse node;

whereby the forward current source outputs an idle forward source current, the forward current sink inputs substantially all of the forward source current, the reverse current source outputs an idle reverse source current, and the reverse current sink inputs substantially all of the idle reverse source current when the amplitude of the first signal and the second signal is substantially equivalent, the forward current source outputs an increased forward source current, the reverse current source outputs a reduced reverse current, the forward current sink inputs a minority portion of the increased forward source current, and the reverse current sink inputs a majority of the increased forward source current and the reduced reverse source current when the difference between the amplitude of the first signal and the second signal is positive, and the forward current source outputs a reduced forward source current, the reverse current source outputs an increased reverse source current, the forward current sink inputs a majority portion of the increased reverse source current and the reduced forward source current, and the reverse current sink inputs the reduced reverse source current when the difference between the amplitude of the first signal and the second signal is negative.

2. The differential output stage of claim 1 wherein each of the forward current source, the reverse current source, the forward current sink and the reverse current sink comprises a differential amplifier.

3. The differential output stage of claim 2 wherein the differential amplifier comprises a unity-gain amplifier.

4. The differential output stage of claim 1 wherein the forward current source further comprises:

a driver transistor stage that generates the idle forward source current, the increased forward source current, and the reduced forward source current;

a source differential pair stage that is connected to the driver transistor stage, and that controls the driver transistor stage;

a source slew rate stage that is connected to the driver transistor stage, and that increases the slew rate of the driver transistor stage; and a source compensation capacitor that is connected to the driver transistor stage and the source differential pair stage, and that prevents oscillation in the voltage at the forward node.

5. The differential output stage of claim 4 wherein the forward current sink further comprises:

a sinking transistor stage that inputs the idle forward source current, the minority portion of the increased forward source current, and the reduced forward source current;

a sinking differential pair stage that is connected to the sinking transistor stage, and that controls the sinking transistor stage;

a sinking slew rate stage that is connected to the sinking transistor stage, and that increases the slew rate of the sinking transistor stage; and a sinking compensation capacitor that is connected to the sinking transistor stage and the sinking differential pair stage, and that prevents oscillation in the voltage at the forward node.

6. The differential output stage of claim 5 wherein the driver transistor stage comprises:

a driver transistor stage connected to the forward node, the source differential pair stage, and the source compensation capacitor, the driver transistor having a channel width; and a source balancing transistor connected to the forward node, the source input slew rate stage, and the driver transistor.

7. The differential output stage of claim 6 wherein the sinking transistor stage comprises:

a sinking transistor connected to the forward node, the sinking differential pair stage, and the sinking compensation capacitor, the sinking transistor having a channel width; and a sinking balancing transistor connected to the forward node, the sinking input slew rate stage, and the sinking transistor.

8. The differential output stage of claim 7 wherein the channel width of the driver transistor is approximately two to three times greater than the channel width of the sinking transistor.

9. A differential output stage for generating a differential signal across an external resistor in response to the difference in amplitude between a first signal and a second signal, the differential output stage comprising:

a forward node and a reverse node, the external resistor being connectable therebetween;

a forward current source connected to the first signal that outputs (i) an idle forward source current into the forward node when the amplitude of the first signal and the amplitude of the second signal are substantially equivalent, (i) an increased forward source between the amplitude of the first signal and the amplitude of the second signal is positive, and (iii) a reduced forward source current into the forward node when the difference between the amplitude of the first signal and the amplitude of the second signal is negative;

a reverse current source connected to the second signal that outputs (i) and idle reverse source current into the reverse node when the amplitude of the first signal and the amplitude of the second signal are substantially equivalent, (ii) a reduced reverse source current when the difference between the amplitude of the first signal and the amplitude of the second signal is positive, and (iii) an increased reverse source current when the difference between the amplitude of the first signal and the amplitude of the second signal is negative;

a forward current sink connected to the first signal that inputs (i) substantially all of the idle forward source current when the amplitude of the first signal and the amplitude of the second signal are substantially equivalent, (ii) a minority portion of the increased forward source current when the difference between the amplitude of the first signal and the amplitude of the second signal is positive, and (iii) a majority portion of the increased reverse source current and the reduced forward source current when the difference between the amplitude of the first signal and the amplitude of the second signal is negative; and a reverse current sink connected to the second signal that inputs (i) the idle reverse source current when the amplitude of the first signal and the amplitude of the second signal are substantially equivalent, (ii) a majority of the increased forward source current and the reduced reverse source current when the difference between the amplitude of the first signal and the amplitude of the second signal is positive, and (iii) a minority portion of the increased reverse source current when the difference between the amplitude of the first signal and the amplitude of the second signal is negative, wherein a positive portion of the difference signal is generated when a portion of the increased forward source current flow across the external resistor from the forward current source to the reverse current sink and a negative portion of the difference signal is generated when a portion of the increased reverse source current flows across the external resistor from the reverse current source to the forward current sink.

10. The differential output stage of claim 9 wherein each of the forward current source, the reverse current source, the forward current sink and the reverse current sink further comprises a differential amplifier.

11. The differential output stage of claim 10 wherein the differential amplifier comprises a unity-gain amplifier.

12. A differential output stage for generating a differential signal across an external resistor in response to the difference in voltages between a first signal and a second signal, the differential output stage comprising:

a forward node and a reverse node, the external resistor being connectable therebetween;

a forward current source that generates a reverse current into the forward node in response to the voltage of the first signal and the voltage at the forward node;

a reverse current source that generates a reverse current into the reverse node in response to the voltage of the second signal and the voltage at the reverse node;

a forward current sink that sinks a first current from the forward node in response to the voltage of the first signal and the voltage at the forward node;

a reverse current sink that sinks a second current from the reverse node in response to the voltage of the second signal and the voltage at the reverse node, whereby when the voltage of the first signal and the voltage of the second signal are substantially equivalent, the magnitude of the forward current is substantially equivalent to the magnitude of the first current, and the magnitude of the reverse current is substantially equivalent to the magnitude of the second current, thereby causing no current to flow across the external resistor, whereby when the difference between the voltage of the first signal and the voltage of the second signal is positive, the magnitude of the forward current is greater than the magnitude of the first current, and the magnitude of the reverse current is less than the magnitude of the second current, thereby causing a current to flow across the external resistor from the forward node to the reverse node, and whereby when the difference between the voltage of the first signal and the voltage of the second signal is negative, the magnitude of the forward current is less than the magnitude of the first current, and the magnitude of the reverse current is greater than the magnitude of the second current, thereby causing a current to flow across the external resistor from the reverse node to the forward node.

13. The differential output stage of claim 12 wherein each of the forward current source, the reverse current source, the forward current sink and the reverse current sink further comprises a differential amplifier.

14. The differential output stage of claim 12 wherein the differential amplifier comprises a unity-gain amplifier.

15. The differential output stage of claim 12 wherein the first signal and the second signal are complementary signals.

16. The differential output stage of claim 9 wherein the first signal and the second signal are complementary signals.

17. The differential output stage of claim 1 wherein the first signal and the second signal are complementary signals.

* * * * *

UNITED STATES PATENT AND TRADEMARK OFFICE
CERTIFICATE OF CORRECTION

PATENT NO. : 5,336,946
DATED : August 9, 1994
INVENTOR(S) : Para K. Segaram et al.

It is certified that error appears in the above-indentified patent and that said Letters Patent is hereby corrected as shown below:

In Col. 12, line 38, delete "(i)" and replace with --(ii)--.

In Col. 12, line 39, after "source" insert --current into the forward node when the difference--.

In Col. 13, line 15, delete "flow" and replace with --flows--.

In Col. 13, line 35, delete "reverse" and replace with --forward--.

Signed and Sealed this

Eleventh Day of October, 1994

Attest:

BRUCE LEHMAN

Attesting Officer

Commissioner of Patents and Trademarks